United States Patent
Karpman et al.

(10) Patent No.: US 7,166,911 B2
(45) Date of Patent: Jan. 23, 2007

(54) PACKAGED MICROCHIP WITH PREMOLDED-TYPE PACKAGE

(75) Inventors: Maurice S. Karpman, Brookline, MA (US); Nicole Hablutzel, Cambridge, MA (US); Peter W. Farrell, Lunenburg, MA (US); Michael W. Judy, Wakefield, MA (US); Lawrence E. Felton, Hopkinton, MA (US); Lewis Long, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/952,424

(22) Filed: Sep. 28, 2004

(65) Prior Publication Data

US 2005/0035446 A1    Feb. 17, 2005

Related U.S. Application Data

(63) Continuation-in-part of application No. 10/369,776, filed on Feb. 20, 2003, which is a continuation-in-part of application No. 10/326,640, filed on Dec. 19, 2002, now Pat. No. 6,946,742, which is a continuation-in-part of application No. 10/234,215, filed on Sep. 4, 2002, now Pat. No. 6,768,196.

(51) Int. Cl.
*H01L 23/12*      (2006.01)
(52) U.S. Cl. ............... 257/711; 257/710; 257/669; 257/E23.188
(58) Field of Classification Search ............... 257/711, 257/710, 733, 669, E23.004, E23.026, E23.031, 257/E23.183, E23.184, E23.185, E23.186, 257/E23.188
See application file for complete search history.

(56) References Cited

U.S. PATENT DOCUMENTS 4,710,744 A    12/1987 Wamstad ................ 338/4

(Continued)

FOREIGN PATENT DOCUMENTS

WO    WO 91/05368    4/1991

(Continued)

OTHER PUBLICATIONS

Blackwell, The Electronic Packaging Handbook, CRC Press LLC, pp. 2-3, 7-1, 7-3, 7-12, A-9, and A-11, 2000.

(Continued)

*Primary Examiner*—Evan Pert
*Assistant Examiner*—Victor A. Mandala, Jr.
(74) *Attorney, Agent, or Firm*—Bromberg & Sunstein LLP

(57) ABSTRACT

A MEMS inertial sensor is secured within a premolded-type package formed, at least in part, from a low moisture permeable molding material. Consequently, such a motion detector should be capable of being produced more economically than those using ceramic packages. To those ends, the package has at least one wall (having a low moisture permeability) extending from a leadframe to form a cavity, and an isolator (with a top surface) within the cavity. The MEMS inertial sensor has a movable structure suspended above a substrate having a bottom surface. The substrate bottom surface is secured to the isolator top surface at a contact area. In illustrative embodiments, the contact area is less than the surface area of the bottom surface of the substrate. Accordingly, the isolator forms a space between at least a portion of the bottom substrate surface and the package. This space thus is free of the isolator. Moreover, due to the low moisture permeability of the package, further production steps can be avoided while ensuring that moisture does not adversely affect the MEMS inertial sensor within the cavity.

21 Claims, 3 Drawing Sheets

U.S. PATENT DOCUMENTS

| | | | |
|---|---|---|---|
| 4,740,410 A | 4/1988 | Muller et al. | 428/133 |
| 4,800,758 A | 1/1989 | Knecht et al. | 73/727 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 5,105,258 A | 4/1992 | Silvis et al. | 257/748 |
| 5,207,102 A | 5/1993 | Takahashi et al. | 73/727 |
| 5,241,133 A | 8/1993 | Mullen, III et al. | 174/52.4 |
| 5,273,939 A | 12/1993 | Becker et al. | 437/209 |
| 5,315,155 A * | 5/1994 | O'Donnelly et al. | 257/711 |
| 5,336,928 A | 8/1994 | Neugebauer et al. | 257/758 |
| 5,468,999 A | 11/1995 | Lin et al. | 257/784 |
| 5,515,732 A | 5/1996 | Wilcox et al. | 73/724 |
| 5,939,633 A | 8/1999 | Judy | 73/514.32 |
| 5,945,605 A | 8/1999 | Julian et al. | 73/727 |
| 5,994,161 A | 11/1999 | Bitko et al. | 438/53 |
| 6,137,170 A * | 10/2000 | Ujiie et al. | 257/711 |
| 6,169,328 B1 | 1/2001 | Mitchel et al. | 257/778 |
| 6,309,915 B1 | 10/2001 | Distefano | 438/127 |
| 6,443,179 B1 * | 9/2002 | Benavides et al. | 137/454.2 |
| 6,505,511 B1 | 1/2003 | Geen et al. | 73/504.12 |
| 6,617,683 B2 * | 9/2003 | Lebonheur et al. | 257/707 |
| 6,667,557 B2 | 12/2003 | Alcoe et al. | 257/778 |
| 6,768,196 B2 | 7/2004 | Harney et al. | 257/729 |
| 2001/0055836 A1 | 12/2001 | Kunda | 438/108 |
| 2004/0041254 A1* | 3/2004 | Long et al. | 257/703 |

FOREIGN PATENT DOCUMENTS

WO  WO 2004/022477 A1  3/2004

OTHER PUBLICATIONS

Brown, Advanced Electronic Packaging With Emphasis on Multichip Modules, Institute of Electrical and Electronics Engineers, Inc., pp. 4, 8, 568, 1999.

Tummala et al., Microelectronics Packaging Handbook Semiconductor Packaging Part II, Second Edition, Chapman & Hall, pp. II-12, 1997.

Pecht, Handbook of Electronic Package Design, Marcel Dekker, Inc., pp. 173, 179, 196, 210, 736, 744, 821, and 832, 1991.

Heuberger, Mikromechanik, Springer Verlag A.G., pp. 470-476, 1989. With Translation.

Department of Defense, Test Method Standard Microcircuits, FSC 5962, completed 1997.

Patent Abstracts of Japan, vol. 009, No. 216 (E-340), Sep. 3, 1985 & JP 60 077434 A (Mitsubishi Denki KK), May 2, 1985 abstract.

Patent Abstracts of Japan, vol. 1995, No. 09, Oct. 31, 1995 & JP 07 142518 A (Hitachi LTD), Jun. 2, 1995 abstract.

Patent Abstracts of Japan, vol. 1996, No. 09, Sep. 30, 1996 & JP 08 116007 A (NEC Corp.), May 7, 1996.

Patent Abstracts of Japan, vol. 017, No. 672 (E-1474), Dec. 10, 1993 & JP 05 226501 A (Nissan Motor Co. LTD), Sep. 3, 1993 abstract.

Patent Abstracts of Japan, vol. 012, No. 111 (E-598), Apr. 8, 1988 & JP 62 241355 A (Hitachi LTD; others: 01), Oct. 22, 1987 abstract.

* cited by examiner

PACKAGED MICROCHIP WITH PREMOLDED-TYPE PACKAGE

PRIORITY

This patent application is a continuation-in-part of and claims the earliest priority date from U.S. patent application Ser. No. 10/369,776, filed Feb. 20, 2003, entitled, "PACKAGED MICROCHIP," and naming Lewis Long and Kieran Harney as inventors, the disclosure of which is incorporated herein, in its entirety, by reference. As a result of this priority claim, this patent application thus claims priority from parent U.S. patent application Ser. No. 10/234,215, filed Sep. 4, 2002, now U.S. Pat. No. 6,768,196, the disclosure of which is incorporated herein, in its entirety, by reference.

This patent application also is a continuation-in-part of and claims priority from U.S. patent application Ser. No. 10/326,640, filed Dec. 19, 2002, entitled, "PACKAGED MICROCHIP WITH ISOLATOR HAVING SELECTED MODULUS OF ELASTICITY," and naming Maurice Karpman as inventor, the disclosure of which is incorporated herein, in its entirety, by reference.

RELATED APPLICATIONS

This patent application is related to United States patent application Ser. No. 10/952,330, filed on even date herewith, entitled, "STRESS SENSITIVE MICROCHIP WITH PREMOLDED-TYPE PACKAGE," and naming Maurice S. Karpman, Nicole Hablutzel, Peter W. Farrell, Michael W. Judy, and Lawrence E. Felton as inventors, the disclosure of which is incorporated herein, in its entirety, by reference.

FIELD OF THE INVENTION

The invention generally relates microchips and, more particularly, the invention relates packaging techniques for microchips.

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The associated electronics, substrate, and movable structure typically are formed on one or more dies (referred to herein simply as a "die") that are secured within a package. The package includes interconnects that permit the electronics to transmit the movement data to the external devices. To secure the die to the package interior 18, the bottom surface of the die commonly is bonded (e.g., with an adhesive or solder) to an internal surface of the package. Accordingly, in such case, substantially all of the area of the die bottom surface is bonded to the internal surface of the package.

MEMS inertial sensors/die are sensitive to environmental factors, such as disparate material expansion between the die and its package. Specifically, this disparate expansion commonly is caused by mismatched coefficients of thermal expansion ("CTE") between the materials forming the die bottom surface and the internal package surface that secures the die. In fact, these CTE mismatches can cause the sensor to deliver incorrect motion measurements. For example, when implemented as an accelerometer within an automobile airbag system or as a gyroscope in an automobile traction control system, CTE mismatches can produce results that can cause the automobile to operate erratically. Consequently, such incorrect measurements can lead to bodily injury or death for drivers, their passengers, or others near the moving automobile (e.g., people in other automobiles).

To reduce this problem, MEMS inertial sensors commonly are secured within ceramic packages rather than within two other well known, less costly, but widely used package types; namely, "transfer molded" packages and "premolded" packages. Specifically, both transfer molded packages and premolded packages have a copper leadframe to which the die is secured. The CTE difference between copper and silicon (i.e., the material forming the die), however, is much greater than the CTE difference between ceramic and silicon.

Moreover, transfer molded and premolded packages also typically cannot provide hermeticity. Accordingly, if such types of packages are used with certain MEMS sensors, additional processes are required to ensure that moisture does not affect the sensor itself.

For these and other reasons, those in the art are motivated to use ceramic packages for MEMS inertial sensors rather than the other two types of packages. Undesirably, ceramic packages typically are more expensive than the other two types of packages. In addition, securing a MEMS sensor die within a ceramic package requires a larger number of process steps (when compared to the other noted types of packages), thus further increasing production costs. In fact, in many MEMS sensor applications using ceramic packages, the packaging cost far exceeds the cost of producing the MEMS sensor itself.

SUMMARY OF THE INVENTION

In accordance with one aspect of the invention, a MEMS inertial sensor is secured within a premolded-type package formed, at least in part, from a low moisture permeable molding material. Consequently, such a motion detector should be capable of being produced more economically than those using ceramic packages. To those ends, the package has at least one wall (having a low moisture permeability) extending from a leadframe to form a cavity, and an isolator (with a top surface) within the cavity. The MEMS inertial sensor has a movable structure suspended above a substrate having a bottom surface. The substrate bottom surface is secured to the isolator top surface at a contact area. In illustrative embodiments, the contact area is less than the surface area of the bottom surface of the substrate. Accordingly, the isolator forms a space between at least a portion of the bottom substrate surface and the package. This space thus is free of the isolator. Moreover, due to the low moisture permeability of the package, further production steps can be avoided while ensuring that moisture does not adversely affect the MEMS inertial sensor within the cavity.

The wall may be formed from any low moisture permeability material, such as a liquid crystal polymer. To ensure hermeticity, the motion detector also has a low moisture permeability lid secured to the at least one wall.

Different types of isolators may be used. For example, the isolator may be formed from the leadframe. Additionally or alternatively, the isolator may have a plurality of protrusions extending from the base of the cavity. In some embodiments, the isolator is formed from a low moisture permeability molding material. In still other embodiments, the isolator is at least in part formed from a silicone material. Such a soft moldable material should mitigate stresses. Other embodiments form the isolator, at least in part, from one or more different moldable materials.

In accordance with another aspect of the invention, a motion detector has a premolded-type package that contains an inertial sensor die. The package has an isolator, a leadframe, and at least one wall extending from the leadframe to at least in part form a cavity. The cavity contains the isolator and is formed from at least one material having a low moisture permeability. The bottom surface of the die is secured to the isolator top surface at a contact area that is less than the bottom surface area of the die. In a manner similar to other aspects, the isolator forms a space between at least a portion of the die bottom surface and the package. This space is free of the isolator.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Illustrative embodiments of the invention substantially reduce chip stresses associated with conventional premolded-type packages so they can be successfully used to package stress sensitive microchips. Accordingly, because of the lower cost of premolded packages (when compared to ceramic packages), such embodiments can significantly reduce production costs while maintaining desired performance. Moreover, illustrative embodiments further enable premolded-type packages to provide hermetically sealed environments, thus enabling use with a variety of microchips requiring hermeticity. Details of illustrative embodiments are discussed below.

Figure 1:
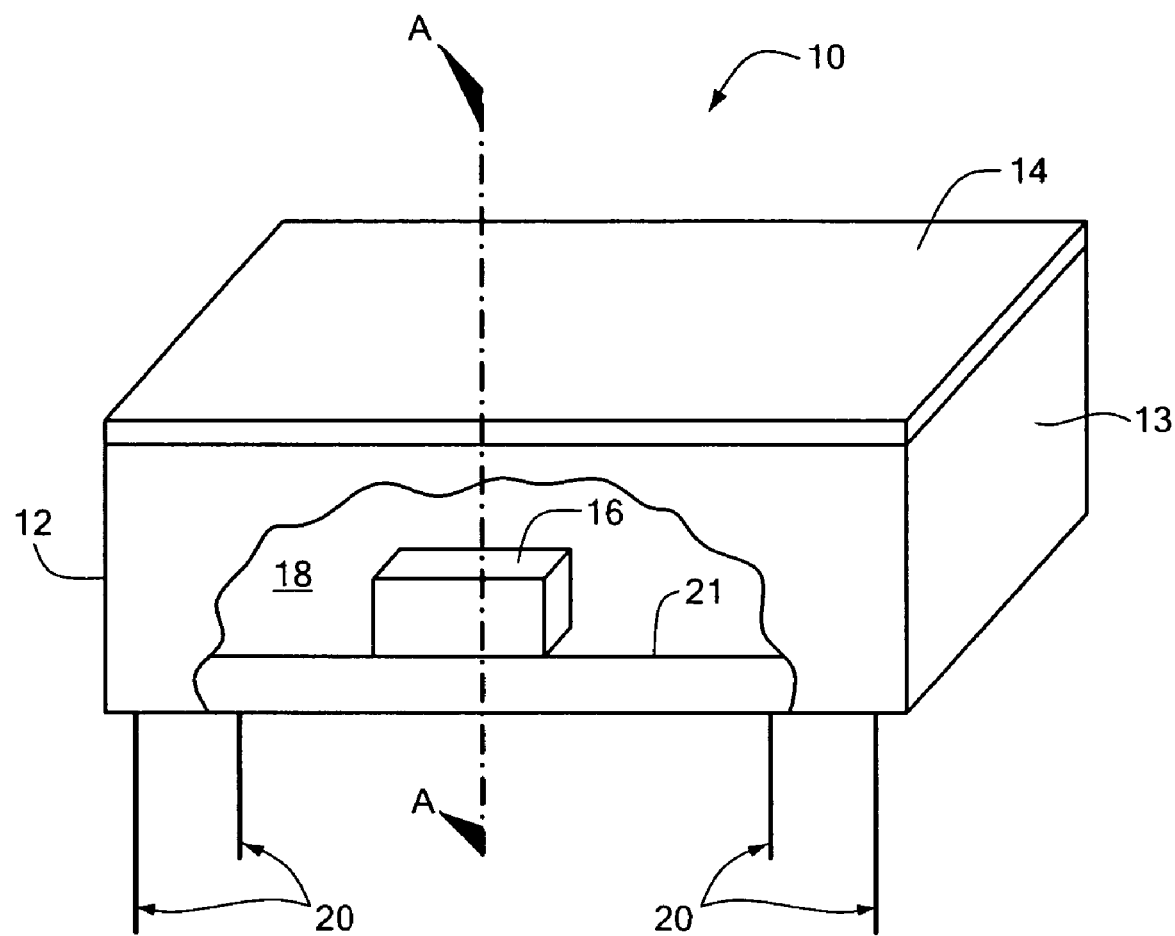
FIG. 1 schematically shows a partially cut-away view of a packaged microchip that may be produced in accordance with illustrative embodiments of the invention.

FIG. 1 schematically shows a partially cut-away isometric view of a packaged microchip 10 that can implement various embodiments of the invention. In illustrative embodiments, the packaged microchip 10 is a MEMS device implemented as an angular rate sensor. Accordingly, for illustrative purposes, various embodiments are discussed herein as a MEMS angular rate sensor. The MEMS devices shown in FIGS. 1–4 thus may be generally identified herein as angular rate sensors 10 or motion detectors. It should be noted, however, that discussion of various embodiments as a MEMS angular rate sensor is exemplary only and thus, not intended to limit all embodiments of the invention. Accordingly, some embodiments may apply to other types of microchip devices, such as integrated circuits. In addition, embodiments of the invention can be applied to other types of MEMS devices, such as MEMS-based optical switching devices and MEMS-based accelerometers.

The angular rate sensor 10 shown in FIG. 1 includes a conventional premolded-type package 12 having walls 13 extending from a base 21, a lid 14 secured to the walls 13 for sealing the package 12, and a conventional angular rate sensor die 16 (referred to herein as "die 16," also referred to as a "microchip") secured within the hermetically sealed interior 18. The die 16 includes the well known mechanical structure and electronics (discussed below) that measure angular motion about a given axis. A plurality of pins 20 extending from the package 12 electrically connect with the die 16 to permit electrical communication between the angular rate sensor electronics and an exterior device (e.g., a computer).

In accordance with illustrative embodiments of the invention, the die 16 is bonded to a stress reducing isolator 22 (shown in FIGS. 2–4) extending inwardly from the base 21 of the package interior 18. The isolator 22 illustratively has a top surface 25 with a surface area that is less than that of the die bottom surface 26. Accordingly, because less than the entire die bottom surface 26 couples with the package 12, stresses from the package 12 should be minimized. Moreover, in illustrative embodiments, the package 12 is formed from a moldable material having a low moisture permeability (i.e., a moldable material that is capable of providing hermeticity). Combining these features should enable use of a pre-molded type of package 12 with a stress sensitive die 16 requiring hermeticity. Details of various embodiments follow.

The isolator 22 preferably is formed from a material that substantially further minimizes stresses between the remainder of the package 12 and the sensor die 16. In one embodiment of the invention, the isolator 22 is integrally formed from the moldable material making up the remainder of the package. Among other ways, such a package 12 may be formed by using conventional injection molding processes, or dispensing processes. In another embodiment, the isolator 22 may be formed from the die paddle 38 portion of the package leadframe 24. In yet another embodiment, the isolator 22 may be a non-moldable material (e.g., a silicon stud) secured to molding material forming much of the remainder of the package 12.

Figure 2:
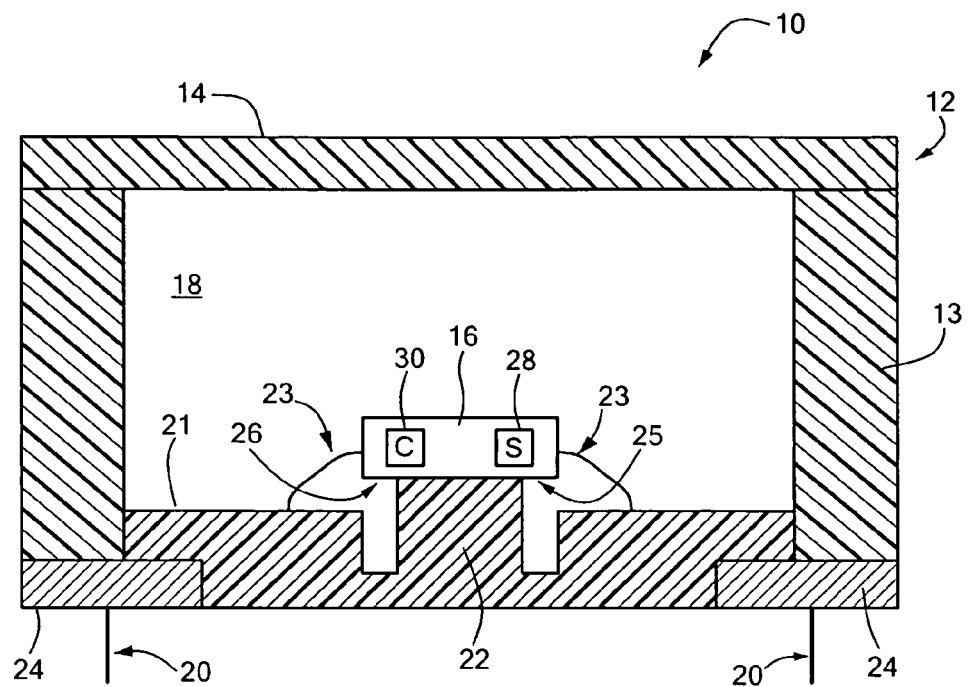
FIG. 2 schematically shows a cross-sectional view along line A—A of FIG. 1 of one embodiment of the invention.
Figure 3:
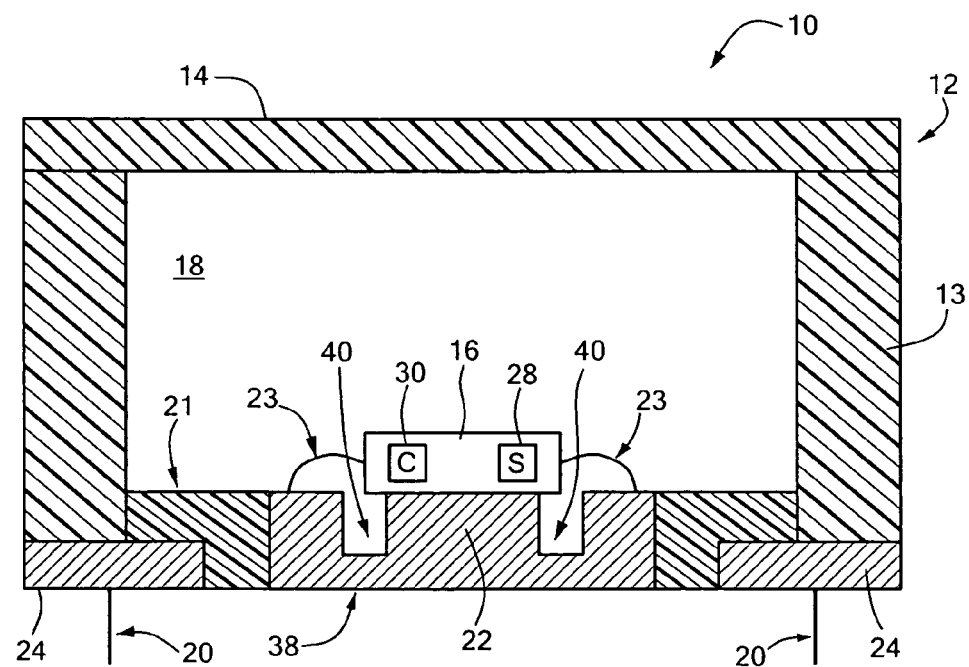
FIG. 3 schematically shows a cross-sectional view along line A—A of FIG. 1 of one embodiment of the invention.
Figure 4:
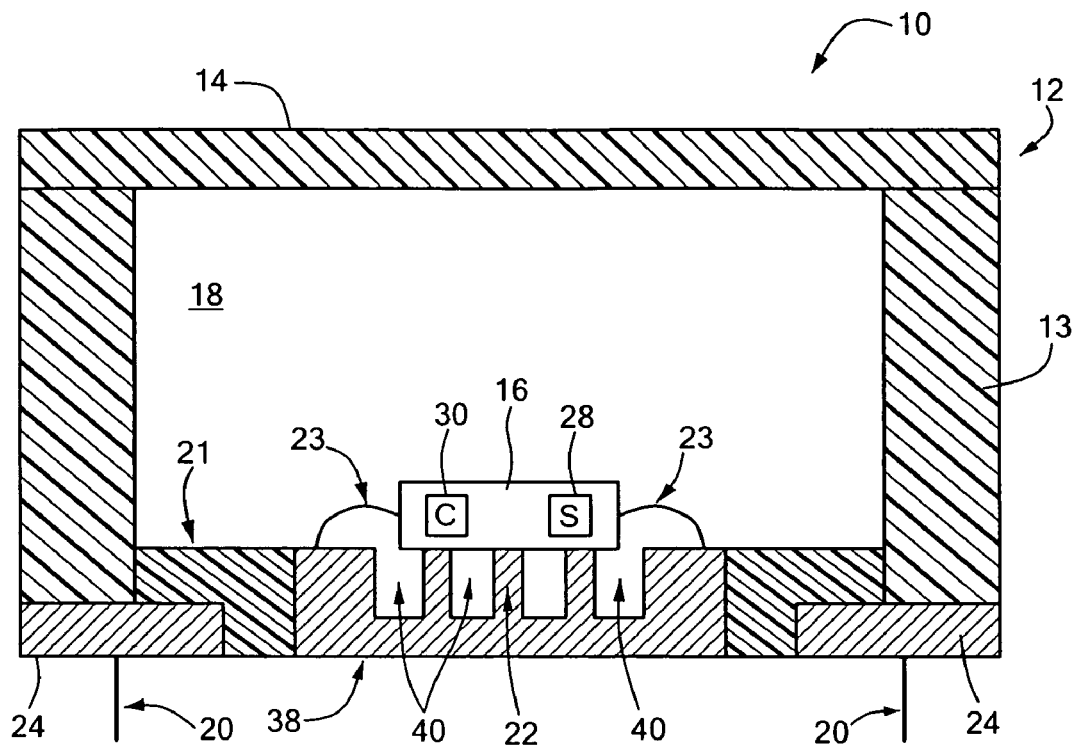
FIG. 4 schematically shows a cross-sectional view along line A—A of FIG. 1 of one embodiment of the invention.

FIGS. 2–4 schematically show three embodiments of the packaged microchip 10 along line A—A of FIG. 1. In particular, FIG. 2 schematically shows a first embodiment of the invention, in which a moldable material substantially integrally mates with a leadframe 24 (not shown in FIG. 1) to form the noted isolator 22. A moldable material having a low moisture permeability and adequate adhesion property with the copper leadframe 24 should be used. Among others, such a moldable material may include a liquid crystal polymer, which provides hermeticity.

The package 12 is considered to be "hermetic" when it complies with the well known "MIL Standard." Specifically, the package 12 is considered to be hermetic when it complies with MIL-STD 883D, method 1014.9, entitled, "Seal," which is incorporated herein, in its entirety, by reference.

As noted above, the die 16 includes conventional silicon MEMS structure 28 to mechanically sense angular rotation, and accompanying electronics 30. Such structure 28 and electronics 30 (both shown schematically in FIGS. 2–4) illustratively are formed on a silicon-on-insulator wafer, which has an oxide layer between a pair of silicon layers. Alternatively, the structure 28 and electronics 30 may be formed by conventional surface deposition techniques, or some other conventional means known in the art. As an example, among other things, the MEMS structure 28 may include one or more vibrating masses suspended above a silicon substrate by a plurality of flexures. The structure 28 also may include a comb drive and sensing apparatus to both drive the vibrating masses and sense their motion.

Accordingly, the electronics 30 may include, among other things, the driving and sensing electronics that couple with the comb drive and sensing apparatus, and signal transmission circuitry. Wires 23 electrically connect the accompanying electronics 30 with the pins 20. Exemplary MEMS inertial sensors/motion detectors are discussed in greater detail in U.S. Pat. Nos. 5,939,633 and 6,505,511, which are assigned to Analog Devices, Inc. of Norwood, Mass. The disclosures of both of the noted patents are incorporated herein, in their entireties, by reference.

In alternative embodiments, the MEMS structure 28 and accompanying electronics 30 are on different dies 16. For example, the die 16 having the MEMS structure 28 may be mounted to the package 12 at a first isolator 22, while the die 16 having the accompanying electronics 30 may be mounted to the package 12 at a second isolator 22. Alternatively, both dies 16 may be mounted to the same isolator 22. In some cases, one of the dies 16 (e.g., a stress sensitive die 16) may be mounted to an isolator 22 having stress reduction properties, while the other die 16 (e.g., a non-stress sensitive die 16) may be mounted directly to the package 12.

The die 16, which is a microchip/integrated circuit, is sensitive to both linear and torsional stress. In this context, the term "sensitive" generally means that the operation of the structure 28 and/or electronics 30 on the die 16 can be compromised when subjected to such stress. For example, as suggested above, stress applied to the die 16 can cause the flexures suspending the mass to bend or compress to some extent. As a consequence, the mass may not vibrate at a prescribed rate and angle, thus producing a quadrature problem. As a further example, the comb drive may become misaligned, or the electronics 30 may become damaged. Any of these exemplary problems undesirably can corrupt the resulting data produced by the MEMS die 16. Accordingly, for these reasons, the die 16 or other microchip may be referred to as being "stress sensitive."

To solve these stress related problems, as noted above, the isolator 22 illustratively is formed to have a top surface 25 with a smaller area than that of the bottom surface of the die 16. In other words, the top surface 25 of the isolator 22 contacts the bottom surface of the die 16 at a contact area. This contact area is smaller than the area of the die bottom surface 26. As a result, the isolator 22 forms a space between the die bottom surface 26 and the base 21 of the package 12. Contacting less than the total die bottom surface 26 should reduce stress transmitted from the package 12 to the die 16 (when compared to contacting the entire die bottom surface 26).

Although the isolator 22 in this embodiment is shown as extending above all other portions of the base 21, in alternative embodiments, its top surface 25 may be flush with or below some other portions of the base 21. In either case, the isolator 22 still contacts less than the entire surface area of the die bottom surface 26. Accordingly, the isolator top surface 25 illustratively is not the lowest point of the package base 21.

To further minimize stress, the isolator 22 may be formed from a material having a CTE that more closely matches that of the die 16 than that of the molding material forming the remainder of the package 12. In other words, the CTE of the isolator 22 contacting the die 16 may be closer to that of the die 16 than that of the molding material forming much of the remainder of the package 12. To that end, the isolator 22 may be formed from silicon, which has a CTE that matches that of a silicon substrate. Of course, other materials may be used, depending upon the substrate type.

Rather than (or in addition to) matching the CTEs of the die 16 and isolator 22, some other embodiments form the isolator 22 from a material having a modulus of elasticity that substantially negates CTE mismatches. More specifically, in such embodiments, the package 12 is formed from at least two materials; namely, a first (moldable) material that makes up much of the package 12 (i.e., the portion referred to above as the remainder of the package 12), and a second (moldable) material that makes up the isolator 22. In illustrative embodiments, the second material is much softer than the first material. If the softness of the second material is sufficiently lower than that of the first material, CTE mismatches should not affect die performance. To that end, the second material, which forms the isolator portion contacting the die 16, is selected (relative to the first material) to ensure that no more than a negligible thermal stress is transmitted to the die 16. In other words, the ratio of the two moduli is selected so that no more than a negligible amount of stress is transmitted from the package 12 to the die 16 (via the isolator 22). For example, the first material may be a liquid crystal polymer, while the second material, which contacts the die 16, may be silicone. Such negligible amount of stress should have a negligible impact on die performance.

A negligible impact on performance means that the die 16 produces a signal that is satisfactory for its intended purpose. For example, a negligible error may be considered to have occurred when the output results can be used (for their intended purpose) without the need for additional corrective circuitry to correct a stress-induced error. As known by those skilled in the art, such results depend upon the application for which the die 16 is produced. If the die 16 is a roll-over angular rate sensor, for example, a negligible error may be considered to occur if the die results are within about fifteen percent of the results it would produce in a completely unstressed condition. In other applications, however, to be a negligible error, the results must be much closer to the unstressed results.

See the above incorporated concurrently filed U.S. patent application entitled, "STRESS SENSITIVE MICROCHIP WITH PREMOLDED-TYPE PACKAGE," for additional details relating to this and related embodiments.

In the embodiment shown in FIG. 2, the leadframe 24 does not have a die paddle 38 for supporting the substrate. Instead, the moldable material (either the first material or both the first and second materials, depending upon the implementation) supports the die 16. There may be instances, however, when a die paddle 38 could be used to support the isolator 22. To those ends, FIG. 3 schematically shows another embodiment of the invention, in which the isolator 22 is formed from the die paddle 38. In other embodiments, the isolator 22 is formed over the die paddle 38. In such case, the isolator 22 also may include electrically conductive properties for, among other things, grounding the die 16 to the die paddle 38. Moreover, the isolator 22 also may include thermally conductive properties.

The top surface 25 of the isolator 22 shown in FIGS. 2 and 3 is a substantially flat, rectangular shape. In other embodiments, however, the isolator 22 may be formed in a variety of shapes that minimize surface contact. For example, the isolator 22 in FIG. 4, which is formed from the die paddle 38, has a top surface 25 interrupted by a plurality of trenches 40. The trenches 40 effectively form a plurality of protrusions extending from the base 21 of the package 12. The cumulative surface area of the top surfaces 25 of the protrusions still should be less than that of the die bottom surface 26. Alternatively, the die paddle 38 could be etched to form an effective single projection in a predetermined shape (e.g., a cross or rectangular shape). Among other ways, such shapes could be molded (e.g., if the isolator 22 is moldable material) or etched (e.g., if the isolator 22 is part of the die paddle 38, such as shown in FIGS. 3 and 4).

Figure 5:
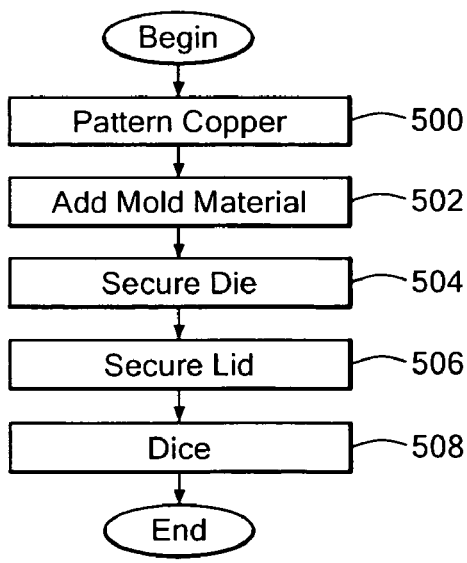
FIG. 5 shows an illustrative process of producing the packaged microchip shown in FIG. 1.

FIG. 5 shows a process of forming the packaged sensors 10 shown in FIGS. 1–4. The process begins at step 500, in which conventional processes pattern and otherwise process a sheet of copper in accordance with conventional processes to form the leadframe 24. In the embodiments shown in FIGS. 3 and 4, the die paddle 38 of the leadframe 24 is etched to have the desired shape/form. In particular, for the embodiment shown in FIG. 3, the die paddle 38 is etched to form a trench/space 40 around its center portion. This trench 40 effectively reduces the surface area of the paddle surface that secures to the die bottom surface 26. In a similar manner, conventional etching processes form a plurality of trenches 40 in the die paddle 38 of the embodiment shown in FIG. 4 to effectively form the noted plurality of protrusions.

After the leadframe 24 is substantially formed, the moldable material is added (step 502). In illustrative embodiments, the moldable material is a low moisture permeability plastic material that adheres well to the leadframe 24. For example, the moldable material may be a liquid crystal polymer. Accordingly, forming the package 12 with such a polymer should provide hermeticity.

In the embodiments that do not use a die paddle 38, conventional injection molding processes may form the isolator 22 from the moldable material. In a manner similar to the embodiments of FIGS. 3 and 4, the isolator 22 can be molded to a desired shape that effectively reduces contact with the die 16. As also noted above, the isolator 22 may be molded with a second material (e.g., having a lower modulus of elasticity than that of the moldable material), or with both the moldable material and a non-moldable material (e.g., a silicon stud). Details are discussed in the noted incorporated patent application filed on even date herewith.

After the moldable material cures, the leadframe 24 carries an array of open packages 12 having walls 13 that form cavities. Accordingly, a die 16 may be secured to the isolator 22 in the base 21 of the cavity of each package 12 (step 504) in the array. Among other ways, each die 16 may be secured by conventional means, such as with an adhesive.

The process continues to step 506, in a lid 14 is secured to each package 12. In some embodiments, the packages 12 and die 16 may be inserted into a gas chamber, which saturates the interiors 18 with a gas. In that case, the lids 14 may be secured when within the gas chamber. Finally, the leadframe 24 and lid 14 may be diced (step 508) to produce a plurality of packaged microchips.

Accordingly, among other benefits, various embodiments discussed above enable stress sensitive microchips to be packaged in high yields while significantly reducing the stresses associated with currently available low cost packaging techniques. Stress sensitive microchips thus can receive the low cost benefits of premolded packages while avoiding both the higher costs and stress associated with ceramic packages. Moreover, illustrative premolded packages provide hermetic environments, thus enabling use of both capped and uncapped dies 16 within such premolded packages.

Although the above discussion discloses various exemplary embodiments of the invention, it should be apparent that those skilled in the art can make various modifications that will achieve some of the advantages of the invention without departing from the true scope of the invention.

What is claimed is:

1. A motion detector comprising:
   a premolded-type package having a leadframe and at least one wall extending from the leadframe to form a cavity, the at least one wall having a low moisture permeability, the package further having an isolator with a top surface, the isolator being within the cavity; and
   a MEMS inertial sensor having a movable structure suspended above a substrate, the substrate having a bottom surface with a bottom surface area, the substrate bottom surface being secured to the isolator top surface at a contact area, the contact area being less than the bottom surface area of the substrate,
   the isolator forming a space between at least a portion of the bottom substrate surface and the package, the space being free of the isolator.

2. The motion detector as defined by claim 1 wherein the at least one wall is formed from a liquid crystal polymer.

3. The motion detector as defined by claim 1 further including a lid secured to the at least one wall to hermetically seal the cavity.

4. The motion detector as defined by claim 1 wherein the isolator is formed from the leadframe.

5. The motion detector as defined by claim 1 wherein the cavity includes a base, the isolator including a plurality of protrusions extending from the base of the cavity.

6. The motion detector as defined by claim 1 wherein the isolator is formed from a low moisture permeability moldable material.

7. The motion detector as defined by claim 1 wherein the isolator is at least in part formed from a silicone material.

8. The motion detector as defined by claim 1 wherein the isolator is formed at least in part from at least one moldable material.

9. A motion detector comprising:
   a premolded-type package having a leadframe and at least one wall extending from the leadframe to at least in part form a cavity, the cavity being formed from at least one material having a low moisture permeability, the package further having an isolator with a top surface, the isolator being within the cavity; and
   an inertial sensor die having a bottom surface with a bottom surface area, the die bottom surface being secured to the isolator top surface at a contact area, the contact area being less than the bottom surface area of the die,
   the isolator forming a space between at least a portion of the die bottom surface and the package, the space being free of the isolator.

10. The motion detector as defined by claim 9 wherein the at least one wall is formed from a low moisture permeability material.

11. The motion detector as defined by claim 9 wherein the at least one wall is formed from a liquid crystal polymer.

12. The motion detector as defined by claim 9 further including a lid having a low moisture permeability, the lid being secured to the at least one wall to hermetically seal the cavity.

13. The motion detector as defined by claim 9 wherein the isolator is formed from the leadframe.

14. The motion detector as defined by claim 9 wherein the cavity includes a base, the isolator including a plurality of protrusions extending from the base of the cavity.

15. The motion detector as defined by claim 9 wherein the isolator is formed at least in part from a silicone material.

16. The motion detector as defined by claim 9 wherein the isolator is formed at least in part from at least one moldable material.

17. A packaged microchip comprising:
a premolded-type package having a leadframe and at least one wall extending from the leadframe to form a cavity, the at least one wall having a low moisture permeability, the package further having an isolator with a top surface, the isolator being within the cavity; and
a microchip having a bottom surface with a bottom surface area, the bottom surface being secured to the isolator top surface at a contact area, the contact area being less than the bottom surface area of the microchip,
the isolator forming a space between at least a portion of the microchip and the package, the space being free of the isolator.

18. The packaged microchip as defined by claim 17 wherein the at least one wall is formed from a liquid crystal polymer.

19. The packaged microchip as defined by claim 17 further including a lid having a low moisture permeability, the lid being secured to the at least one wall to hermetically seal the cavity.

20. The packaged microchip as defined by claim 17 wherein the isolator is formed from at least one of the leadframe and a silicone material.

21. The packaged microchip as defined by claim 17 wherein the isolator is formed at least in part from at least one moldable material.

* * * * *

UNITED STATES PATENT AND TRADEMARK OFFICE
CERTIFICATE OF CORRECTION

| | | |
|---|---|---|
| PATENT NO. | : 7,166,911 B2 | Page 1 of 1 |
| APPLICATION NO. | : 10/952424 | |
| DATED | : January 23, 2007 | |
| INVENTOR(S) | : Maurice S. Karpman et al. | |

It is certified that error appears in the above-identified patent and that said Letters Patent is hereby corrected as shown below:

On title page, item 63 Related U.S. Application Data.
 replace "Feb. 20, 2003, which is a continuation-in-part of application
 No. 10/326,640, filed on Dec. 19, 2002, now Pat. No. 6,946,742," with
 --Feb. 20, 2003,--.

On title page, item 63 Related U.S. Application Data.
 replace "Pat. No. 6,768,196."
 with --Pat. No. 6,768,196. Continuation-in-part of application No. 10/326,640, filed
 on Dec. 19, 2002, now Pat. No. 6,946,742.--.

Signed and Sealed this

Twenty-second Day of May, 2007

JON W. DUDAS
*Director of the United States Patent and Trademark Office*